(12) United States Patent
Matthias

(10) Patent No.: US 10,243,094 B2
(45) Date of Patent: Mar. 26, 2019

(54) METHOD FOR PRODUCING A CONDUCTIVE MULTIPLE SUBSTRATE STACK

(71) Applicant: EV GROUP E. THALLNER GMBH, St. Florian am Inn (AT)

(72) Inventor: Thorsten Matthias, Riedau (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 0 days.

(21) Appl. No.: 15/505,280

(22) PCT Filed: Jul. 1, 2015

(86) PCT No.: PCT/EP2015/064975
§ 371 (c)(1),
(2) Date: Feb. 21, 2017

(87) PCT Pub. No.: WO2016/030053
PCT Pub. Date: Mar. 3, 2016

(65) Prior Publication Data
US 2017/0256663 A1 Sep. 7, 2017

(30) Foreign Application Priority Data
Aug. 29, 2014 (DE) .......... 10 2014 112 430

(51) Int. Cl.
*H01L 31/05* (2014.01)
*H01L 31/0224* (2006.01)
(Continued)

(52) U.S. Cl.
CPC ........ *H01L 31/0512* (2013.01); *H01L 21/187* (2013.01); *H01L 25/043* (2013.01);
(Continued)

(58) Field of Classification Search
CPC ............. H01L 31/0512; H01L 31/043; H01L 31/022425; H01L 21/187; H01L 25/043
See application file for complete search history.

(56) References Cited

U.S. PATENT DOCUMENTS

| 4,338,480 A | 7/1982 | Antypas et al. ............ 136/249 |
| 5,458,694 A | 10/1995 | Nuyen ..................... 136/249 |

(Continued)

FOREIGN PATENT DOCUMENTS

| DE | 102014112430 A1 | 3/2016 | ............. H01L 31/18 |
| EP | 2770540 A1 | 8/2014 | ............. H01L 31/04 |

(Continued)

OTHER PUBLICATIONS

Taguchi et al., GaAs/Si Tandem Solar Cell Using Epitaxial Lift-Off Technique, 3rd World Conference on Photovoltaic Energy Conversion, pp. 769-772 (Year: 2003).*

(Continued)

*Primary Examiner* — Jayne L Mershon
(74) *Attorney, Agent, or Firm* — Kusner & Jaffe

(57) ABSTRACT

A method for producing a multiple-substrate stack from an, in particular wavelength-sensitive, semiconductor substrate and at least one further, in particular wavelength-sensitive, semiconductor substrate with the following steps: applying a dielectric layer, which is electrically conductive at least in certain sections, onto at least one substrate surface of at least one of the semiconductor substrates, and contacting the semiconductor substrate with the further semiconductor substrate and forming an electrically conductive connection between the semiconductor substrates.

17 Claims, 5 Drawing Sheets

(51) Int. Cl.
  *H01L 21/18* (2006.01)
  *H01L 25/04* (2014.01)
  *H01L 31/043* (2014.01)

(52) U.S. Cl.
  CPC .... *H01L 31/022425* (2013.01); *H01L 31/043* (2014.12); *H01L 2924/0002* (2013.01); *Y02E 10/50* (2013.01)

(56) References Cited

U.S. PATENT DOCUMENTS

| | | | |
|---|---|---|---|
| 9,673,167 B2 | 6/2017 | Wimplinger | |
| 2004/0079408 A1* | 4/2004 | Fetzer | H01L 31/184 136/262 |
| 2005/0217717 A1* | 10/2005 | Faris | H01L 31/0392 136/252 |
| 2008/0216885 A1* | 9/2008 | Frolov | H01L 31/0725 136/244 |
| 2009/0032928 A1 | 2/2009 | Chiang et al. | 257/686 |
| 2009/0160012 A1 | 6/2009 | Kim | 257/508 |
| 2009/0239332 A1* | 9/2009 | Fork | H01L 31/022425 438/98 |
| 2010/0090317 A1 | 4/2010 | Zimmermann et al. | 257/621 |
| 2011/0011450 A1* | 1/2011 | Arena | H01L 31/18 136/255 |
| 2011/0291268 A1 | 12/2011 | Wang et al. | 257/737 |
| 2012/0152340 A1 | 6/2012 | Kondo et al. | 136/255 |
| 2013/0075895 A1 | 3/2013 | Miura et al. | 257/737 |
| 2013/0206219 A1* | 8/2013 | Kurtin | H01L 31/02168 136/255 |
| 2014/0102503 A1* | 4/2014 | Schulz | H01B 1/22 136/244 |

FOREIGN PATENT DOCUMENTS

| | | | |
|---|---|---|---|
| JP | 2008-208442 | 9/2008 | B22F 7/08 |
| WO | WO 2008/108990 A1 | 9/2008 | H01L 31/00 |
| WO | WO-2009/121604 A2 | 12/2009 | |
| WO | WO 2010/140522 A1 | 12/2010 | H01L 31/04 |
| WO | WO 2010/140539 A1 | 12/2010 | H01L 31/04 |
| WO | WO 2012/100786 A1 | 8/2012 | H01L 21/18 |
| WO | WO 2012/106002 A1 | 8/2012 | H01L 31/00 |
| WO | WO-2012/115602 A1 | 8/2012 | |
| WO | WO 2012/136266 A1 | 10/2012 | H01L 21/20 |
| WO | WO 2012/136267 A1 | 10/2012 | H01L 21/20 |
| WO | WO 2012/136268 A1 | 10/2012 | H01L 21/20 |
| WO | WO 2014/015899 A1 | 1/2014 | H01L 21/18 |
| WO | WO-2014/015912 A1 | 1/2014 | |
| WO | WO 2016/030053 A1 | 3/2016 | H01L 21/18 |

OTHER PUBLICATIONS

International Search Report from corresponding International Patent Application No. PCT/EP2015/064975, dated Sep. 11, 2015.
Sameshima et al., "Multi Junction Solar Cells Stacked with Transparent and Conductive Adhesive," Japanese Journal of Applied Physics, Japan Society of Applied Physics, vol. 50, May 2011, pp. 052301-1 through 052301-4.

* cited by examiner

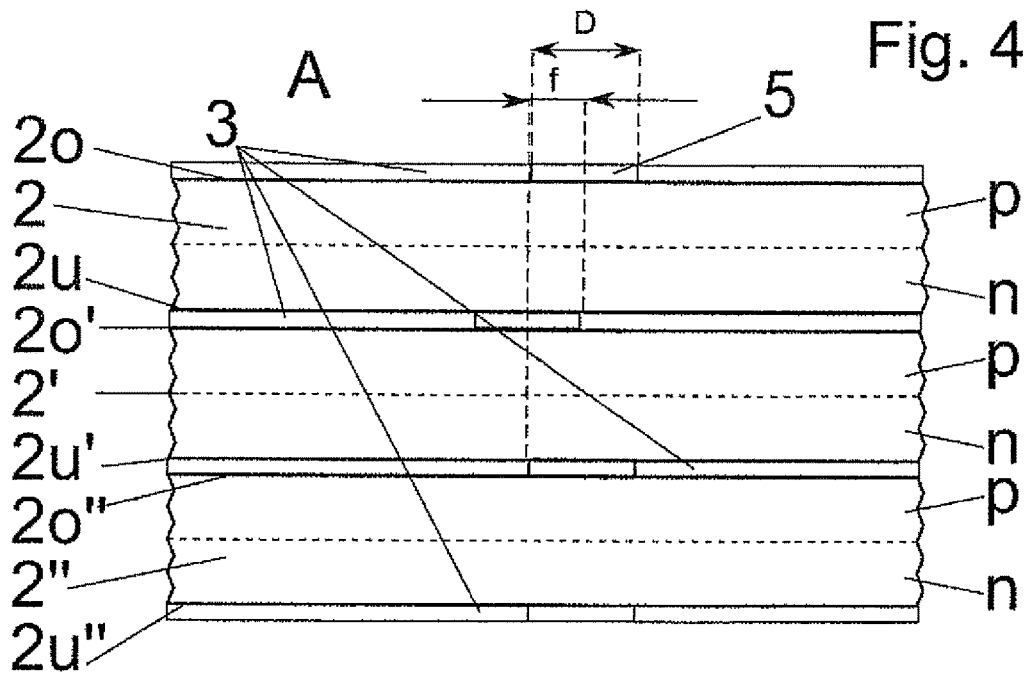
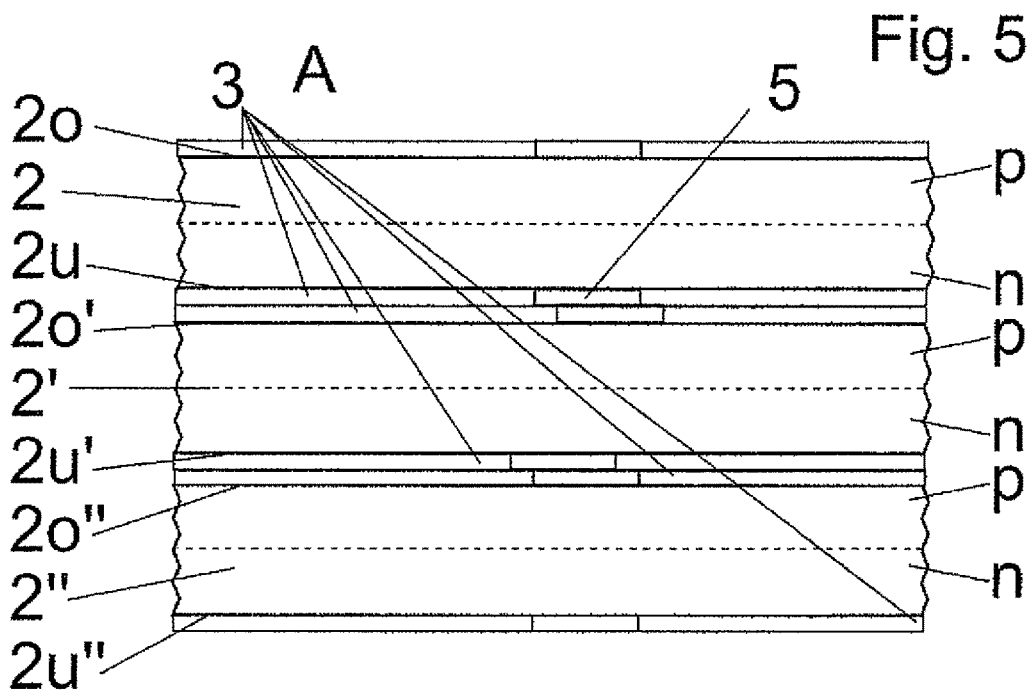

METHOD FOR PRODUCING A CONDUCTIVE MULTIPLE SUBSTRATE STACK

FIELD OF THE INVENTION

The invention relates to a method for producing a multiple-substrate stack.

BACKGROUND OF THE INVENTION

There are diverse technical problems in the production of conductive multiple-substrate stacks, particularly for generating electricity:
- generating the greatest amount of electricity possible for the lowest possible area,
- mass production suitability for the lowest possible costs,
- long-term stability of the electricity generation,
- stability with respect to environmental influences, particularly at connection points,
- reliable electricity generation.

The present invention is therefore based on the object of specifying a method, which at least partially, preferably predominantly, solves the aforementioned problems.

SUMMARY OF THE INVENTION

The object of the present invention is achieved with the features of the independent claim(s). Advantageous developments of the invention are specified in the dependent claims. All combinations of at least two features specified in the description, the claims and/or the figures also fall within the scope of the invention. When value ranges are specified, values lying within the limits mentioned should also be disclosed as limit values and be claimable in any desired combination.

It is the basic idea of the present invention, for the production of a multiple-substrate stack from a (wavelength-sensitive) semiconductor substrate and at least one further (wavelength-sensitive) semiconductor substrate, to carry out the following steps:
- applying a dielectric layer, which is electrically conductive at least in certain sections, onto at least one substrate surface of at least one of the semiconductor substrates, and
- contacting the semiconductor substrate with the further semiconductor substrate and forming an electrically conductive connection between the semiconductor substrates.

According to the invention, a wavelength-sensitive semiconductor substrate is in particular understood to mean a semiconductor substrate suitable for converting a very narrow, specific wavelength range, particularly a single wavelength. The semiconductor substrate in particular is comprised of a semiconductor as matrix material. The semiconductor substrate is preferably doped or comprised of a plurality of differently doped regions. According to the invention, in specific embodiments, a wavelength-sensitive semiconductor substrate may also be understood to mean a substrate stack comprising a plurality of, in particular relatively thin substrates, which substrate stack is used for converting a very narrow, specific wavelength range, particularly a single wavelength.

The very narrow, specific wavelength range, particularly the single wavelength, for which the mentioned wavelength-specific substrates according to the invention are preferably sensitive, is a part of the wavelength spectrum, which covers the range of UV light, beyond the wavelength range of the visible range to the infrared range. In particular, the wavelength range according to the invention extends from 1 nm to 1 mm, preferably between 50 nm and 50 µm, most preferably between 380 nm and 780 nm.

The invention in particular relates to a method for connecting a plurality of semiconductor substrates, particularly without a highly accurate alignment unit. In particular, the method is used for producing a multiple-layer solar cell, the individual layers of which, particularly semiconductor substrates, have a different wavelength sensitivity, and are connected to one another via conductive connections, preferably TSVs, more preferably by means of nanoparticles in a dielectric layer. Furthermore, the invention relates to a product produced by means of the method.

The invention particularly describes a method of connecting a plurality of substrates, preferably wavelength-sensitive solar cells, to one another in such a manner that, after the connection process, connection points, particularly contact points, have an at most negligible deviation to other connection points, particularly contact points. The process according to the invention in particular copes without an alignment plant and accordingly accelerates the corresponding production process of such a multiple-layer solar cell. The acceleration of the production process is associated with a corresponding cost reduction, which makes the production process cheaper due to an increase in the number of pieces per unit time.

In a very particularly preferred embodiment, a dielectric layer, which is provided with conductive nanoparticles, is applied to at least one of two solar cells which are to be connected to one another. The dielectric properties of the layer allow the bonding of the two solar cells by means of a direct bond or what is known as a fusion bond, whilst the conductive nanoparticles in the dielectric layer produce a connection between the solar cells. In this case, according to the invention, the density of the conductive nanoparticles in the dielectric layer is in particular to be chosen to be so large that at least at a few points along the connection surface, an in particular continuous conductive connection from one solar cell to another takes place by means of the dielectric layer. In this embodiment according to the invention, at least no accurate and preferably no alignment plants are required, as the nanoparticles in particular are distributed over larger areal regions than the pure contact surfaces, preferably over the entire surface, so that contacting always takes place. At the same time, in spite of the (additional) nanoparticles, the optical transparency should be retained as completely as possible, that is to say influenced as little as possible by the nanoparticles. In particular, the absorption capacity and/or the scattering potential should be chosen in such a manner by corresponding selection of the nanoparticles for the sensitive wavelength range of the solar cell, that the absorption capacity and/or the scattering potential are as low as possible.

The nanoparticles have an average diameter smaller than 100 µm, preferably smaller than 10 µm, more preferably smaller than 1 µm, most preferably smaller than 100 nm, most preferably of all smaller than 10 nm.

The greatest advantage of the invention includes the fact that it is possible to dispense with (optical) alignment plants, particularly completely, and the substrate stack is able to exploit an extremely wide wavelength spectrum. According to the invention, it is possible to dispense with (optical) alignment plants, because the elements responsible for the conductive connection, particularly TSVs, contacts, passages, holes or nanoparticles permit a tolerance in the position of the substrates with respect to one another. Insofar as contacting plants comprise alignment, that is to say are also understood in the broadest sense as alignment plants, the selection of an alignment plant with a tolerance or alignment accuracy greater than 0.1 μm, preferably greater than 1 μm, more preferably greater than 10 μm, most preferably greater than 100 μm, most preferably of all greater than 1 mm, is sufficient. As a result, the alignment can not only take place substantially faster, rather the alignment plant can be produced in a substantially less expensive manner.

Furthermore, an embodiment according to the invention advantageously includes the substrate surface comprising a material, particularly an oxide, which is suitable for direct bonding and/or fusion bonding. As a result, the connection of the two substrates to one another is particularly facilitated by the utilization of fusion bonding technology.

The invention therefore describes a method for producing a multiple-layer substrate, comprising at least two substrates, which are connected to one another at least at one point by means of a conductive connection. The connection of the substrates to one another is preferably permanent, but in a particularly preferred embodiment, the formation of a pre-bond takes place before the formation of the permanent bond, which makes it possible to separate the two substrates from one another again before the formation of the permanent connection, to the extent that this should be necessary.

The pre-bond strength is particularly smaller than 2.5 J/m$^2$, preferably smaller than 2 J/m$^2$, preferably smaller than 1.5 J/m$^2$, most preferably smaller than 1.0 J/m$^2$, most preferably of all smaller than 0.1 J/m$^2$.

As a result, it becomes possible according to the invention to test the functionality, particularly the electrical conductivity, of the substrate stack according to the invention, after expansion with a new substrate, before the newly applied substrate is permanently connected to the substrate stack by means of a further process, particularly heat treatment.

The bond strength of the permanent connection after the heat treatment is in this case greater than 0.1 J/m$^2$, preferably greater than 0.5 J/m$^2$, more preferably greater than 1.0 J/m$^2$, most preferably greater than 1.5 J/m$^2$, most preferably of all greater than 2.5 J/m$^2$.

The heat treatment is preferably carried out in a furnace, more preferably in a continuous furnace. The temperature during the heat treatment is in particular lower than 1000° C., preferably lower than 750° C., more preferably lower than 500° C., most preferably lower than 250° C., most preferably of all only slightly higher than room temperature.

The method according to the invention can be applied to all types of substrates, which should be connected to one another via contact points and/or passages and/or doped semiconductor regions. The use of the method according to the invention for producing a multiple-layer solar substrate stack is preferably disclosed.

The production of a permanent bond at temperatures, which lie only slightly above room temperature, may be carried out using exemplary embodiments, as are described for example in WO2012/136267A1, WO2012/100786A1, WO2012/136268A1, WO2012/136266A1, PCT/EP2012/064545. These embodiments and the changes to the substrate stack according to the invention connected therewith are therefore included in this patent specification and may contribute to improving the method/substrate stack according to the invention.

The substrates for production according to the invention of a substrate stack according to the invention can fundamentally have any desired shape and size. In the solar industry, this is preferably rectangular solar panels, which are a few millimetres to a few metres long and wide. These are processed fully automatically in industrial plants. The length and/or width of such, particularly rectangular, solar panels is particularly greater than 10 mm, preferably greater than 100 mm, more preferably greater than 500 mm, most preferably greater than 1000 mm. In particular, very small panels with a width and length of between 10 mm and 300 mm, preferably between 50 mm and 250 mm, more preferably between 100 mm and 200 mm, most preferably of 156 mm, can be produced.

According to a preferred embodiment of the invention, light is focussed onto panels produced according to the invention in order to maximize the luminous efficacy.

According to the invention, it is also conceivable however to produce corresponding substrate stacks at wafer level, particularly for the semiconductor industry. Here, standardized substrates are preferably used, particularly with substrate diameters of 1 inch, 2 inches, 3 inches, 4 inches, 6 inches, 8 inches, 12 inches, 16 inches or 18 inches.

The substrate stack produced according to the invention is comprised of a plurality of substrates connected to one another. The substrates are preferably photocells, therefore semiconductor elements which are able to convert photon energy into electrical energy. The precise physical process shall not be explained in any more detail here. The substrates in particular are comprised of at least one p-doped and at least one n-doped region. Preferably, the substrates are aligned with one another in such a manner that the p-doped and n-doped regions alternate. However, a different arrangement may also be chosen in particular embodiments.

According to an advantageous embodiment, substrate stacks are disclosed with substrates, which have different wavelength-sensitive properties and/or, in particular at least predominantly, preferably completely, non-overlapping regions.

As a result, the yield of photons from the emission spectrum of the Sun is maximized.

In order to maximize the yield of photons of different wavelength, the substrates are thinned according to an advantageous embodiment of the invention. As a result, it is ensured that photons which are arranged furthest from the irradiation side at least predominantly achieve this. In other words, the transfer distance of the photons through the substrate stack to the substrate, which is sensitive for the respective photon wavelength in particular, is minimized. This minimization primarily takes place by means of a thinning of the substrates.

According to the invention, the substrates are produced or chosen to be thinner than 1 mm, preferably thinner than 100 μm, more preferably thinner than 75 μm, most preferably thinner than 50 μm, most preferably thinner than 25 μm, most preferably of all thinner than 1 μm. A premature absorption of the photons and thus a conversion of the photon energy into heat is prevented or at least reduced by means of a lowest possible substrate thickness and therefore a lowest possible substrate stack thickness.

According to the invention, it is conceivable to provide the substrates of the substrate stack with different thicknesses. In particular, the substrate furthest from the irradiation side, that is to say the lowermost substrate, is not thinned or is selected to be thicker than the other substrates of the substrate stack. In particular, substrates with a low degree of transmission for wavelengths, which should reach substrates located therebelow, should be as thin as possible.

Different embodiments according to the invention are described in the following, which can also be combined with one another with reference to individual features in the context of what is technically feasible.

In all embodiments according to the invention, the construction of a plurality of p- and n-doped solar cells is covered by way of example. The method according to the invention is however also fundamentally suitable for all types of substrates which have to be connected to one another, particularly permanently, by means of a bond connection and which should be aligned with respect to one another by means of specific topographies on the surfaces thereof, contacts in particular, without alignment plants in such a manner that the topographies mentioned overlap at least to some extent and thus ensure a corresponding functionality.

In a first embodiment according to the invention for producing the substrate stack according to the invention, oxidation of a substrate only takes place on a single substrate side. For the production according to the invention of a substrate stack, the oxidized side of a first substrate and the non-oxidized side of a second substrate are therefore roughly aligned with respect to one another (particularly without exact alignment of individual contact points with respect to one another) and brought in contact with one another. The contacting of individual contact points takes place by chance in particular.

In a first embodiment according to the invention, each substrate has contacts in the oxide surface and TSVs in the substrate and thus electrically conductive contacts. The oxidized surface therefore constitutes a hybrid surface. The alignment of the two substrates takes place in particular exclusively manually, that is to say without costly, complex and expensive (optical) alignment plants. For example, the use of a pin or a plurality of mechanical pins, on which the two substrates to be connected to one another or a substrate and the already present substrate stack are converged up to the stop, would be conceivable. A mechanical alignment of this type is fast, inexpensive and efficient.

In particular depending on the surface quality of the substrates or of the substrate stack, the exactness of the diameter of the substrate or the substrate stack and/or the surface precision of the pins, the alignment accuracy is better than 1 mm, preferably better than 100 µm, more preferably better than 10 µm, most preferably better than 1 µm, most preferably of all better than 0.1 µm.

To reduce the costs and accelerate the alignment process, particularly depending on the surface quality of the substrates or the substrate stack, the exactness of the diameter of the substrate or the substrate stack and/or surface precision of the pins, the alignment accuracy is in the best case 1 µm, preferably in the best case 10 µm, more preferably in the best case 100 µm.

An important aspect according to the invention in particular includes the fact that contact points are always to be found (by chance) between two substrates brought into contact with one another, which come into contact with one another, without carrying out an exact adjustment of each individual contact point and/or an assignment of individual contact points. A plurality of embodiments according to the invention are disclosed in order to ensure contacting of this type of at least two contact points.

Generally, at least one contacting is required between two substrates, in order to be able to tap and/or transmit a corresponding voltage. According to the invention, an attempt is made to maximize the number of contacts between the contact points of two adjacent substrates in order to increase the electrical conductivity as much as possible and thus to minimize losses.

In an embodiment according to the invention, the contact points are regularly distributed over the substrates. According to the invention, the contact points have a correspondingly large diameter D, which is in particular larger than, and in borderline cases is equal to the inaccuracy with which a mechanical alignment of the substrates with respect to one another is carried out or can be carried out with the plant used. As a result, it is ensured that in on statistical average, there are enough contact points available, in particular the statistical density of the contacting contact points is homogeneous over the entire surface.

According to the invention, the production of the contact points can likewise take place with very imprecise masks and processes, as long as the average diameter D of the contact points is larger than the average alignment error f between the respective contact points. Thus, the production of the contact points on the respective substrate can also take place faster and less expensively. Specifically, the relationship between the average deviation of the diameter D and the average alignment error f is greater than 1, preferably greater than 10, more preferably greater than 100, most preferably greater than 10000. The following example is specified for the average diameter D and the average alignment error f. An ideal contact point has for example a diameter of 1 µm, Due to manufacturing tolerances, the diameter will be slightly larger than or smaller than the desired 1 µm. Nonetheless, on statistical average the diameter is 1 µm, however. If, owing to dispensing with (optical) alignment means in accordance with the invention, the two substrates were to be incorrectly aligned with respect to one another by a distance x, the average alignment error, then at least one pair of two opposite contact points would still generate a conductive connection if the average diameter D of the contact points is larger than the distance f. According to the invention, the surface density of the regularly arranged contact points is in particular greater than $1 \text{ cm}^{-1}$, preferably greater than $100 \text{ cm}^{-1}$, more preferably greater than $10000 \text{ cm}^{-1}$, most preferably greater than $10^6 \text{ cm}^{-1}$, most preferably of all greater than $10^8 \text{ cm}^{-1}$.

In a further embodiment according to the invention, the contact points are irregularly distributed over the respective substrates. Due to the irregular distribution, it is not possible to make any statements about which of the contact points of the two substrates, which are aligned with respect to one another and brought into contact, are contacted with one another. In particular, there is no assignment of contact points to be contacted. In particular, the contacting takes place by chance. However, in the case of a correspondingly high number of such contact points, a desired contacting at a plurality of and at least one point, can practically be guaranteed.

The second embodiment according to the invention is preferred on the basis of two aspects. First, one does not require masking technology to produce the contact points, which are etched into an oxide in particular. The holes in the oxide, in which the contact points are later created, may be produced in a statistically distributed manner by means of the application of etching liquid. After producing the holes in the oxide, a deposition of a correspondingly conductive material then takes place, which material is abraded in further process steps, for example by back thinning, until only the hybrid surface remains.

A second important aspect includes the fact that in such a statistical distribution of the contact points, even less value must be placed on the alignment process. The surface density of the regularly arranged contact points is in particular greater than $1 \text{ cm}^{-1}$, preferably greater than 100 cm$^{-1}$, more preferably greater than 10000 cm$^{-1}$, most preferably greater than 10$^6$cm$^{-1}$, most preferably greater than 10$^8$cm$^{-1}$.

A further important aspect according to the invention is the shape of the contact points. The contact points can take on any desired shape. The contact points are preferably round or rectangular. In a very specific embodiment according to the invention, the contact points are ring-shaped. Ring-shaped contact points may be produced explicitly or result necessarily from the continuation of a TSV which is coated at the edge exclusively. If ring-shaped contact points of this type are located on both substrates, which are to be connected to one another, then the ring-shaped contact points can either be aligned congruently to one another and connected to one another or they touch at two or one intersection point. In each case, an electrically conductive connection takes place. If a correct alignment by means of alignment plants is dispensed with, it is to be assumed that the ring-shaped contact points in most cases intersect at least at two points and the electrical contact is therefore produced at these two points. The embodiment according to the invention of a ring-shaped contact point makes it possible according to the invention to create geometric objects, which cover a large area, and as a result the likelihood of intersecting with a, particularly likewise ring-shaped, contact point located on the opposite substrate increases. In spite of the size of the ring-shaped contact point, which is determined by the diameter, the contacting preferably only takes place at two points and therefore concentrates the electricity onto these two points.

The diameter of the, in particular ring-shaped, contact point is preferably smaller than 100 μm, preferably smaller than 50 μm, more preferably smaller than 25 μm, most preferably smaller than 10 μm, absolutely most preferably smaller than 5 μm. The ring width of the ring-shaped contact point is in particular smaller than 20 μm, preferably smaller than 15 μm, more preferably smaller than 10 μm, most preferably smaller than 5 μm, most preferably of all smaller than 1 μm.

In a second embodiment according to the invention, the electrical connection between the substrates takes place without the help of TSVs and rather exclusively by means of the connection of doped regions, particularly p- and n-doped regions, in the substrate.

In a third embodiment according to the invention, nanoparticles are located (or nanoparticles are introduced) in the oxide layer, which nanoparticles replace the contact points.

The surfaces of the outer side, which are not yet oxidized after the completion of the substrate stack, can, if necessary, be oxidized subsequently and provided with corresponding contact points, at which the voltage can be tapped. However, a further processing of the outer surface without prior oxidation is also conceivable.

In a second embodiment according to the invention for producing the substrate stack according to the invention, the oxidation of a substrate takes place on both opposite sides. In a corresponding preparation of the oxide surfaces, a very fast, exact, reproducible and well-defined connection of the two substrates takes place. The bond produced by such a connection process is termed a pre-bond and, in the case of a correct connection, preferably confirmed by means of testing, is converted by means of a heat-treatment process into a permanent bond.

The exemplary embodiments are therefore identical to the exemplary embodiments in the "Oxidation on only one substrate side section", with the difference of the oxidation on both sides of the substrates.

General characteristics of the substrates are covered hereinafter.

A decisive aspect according to the invention is the structural size of the contact points, passages or nanoparticles. These are particularly preferably especially chosen such that a scattering, particularly reflection, of the photons to the same is minimized. In this case, it may well be that the average size of the contact point and/or the passages and/or the nanoparticles for each substrate or individual substrates of the substrate stack are chosen or constructed differently.

If a substrate stack is structured in such a manner that photons with a high frequency (that is to say a low wavelength) are more strongly absorbed than photons with low frequency (and therefore high wavelength), then according to the invention the substrate is constructed at the surface from a material, which maximizes the yield of high-frequency photons. The low-frequency photons pass this substrate and thus also the contact point and/or passages in the most loss-free manner possible. In this case, care is primarily to be taken to minimize the scattering, particularly the reflection.

Generally, objects with an object diameter in the order of magnitude of the wavelength scatter the corresponding electromagnetic radiation well. Accordingly, the contact points and/or passages in a design according to the invention are designed to be larger in the first substrate than the transmitting radiation, which should penetrate to the lower substrates in the substrate stack according to the invention. Corresponding analogous considerations apply for all further substrates in the series.

The average object size of the contact points and/or the passages is in particular more than 1.1-times, preferably more than 2-times, more preferably more than 5-times, most preferably of all more than 10-times more than the wavelength of the electromagnetic radiation penetrating the substrate. The object size of the contacts and/or passages in the last substrate can in this case in particular be of arbitrary size, but are preferably manufactured to be as small as possible, so that there is as much volume as possible for the material converting the photons. In a very particularly preferred and explicitly disclosed embodiment, the thickness of the lower, final substrate is so large that each photon arriving there is absorbed.

In the following, a particularly preferred and optimum method is disclosed, using which two substrates, particularly solar cells, can be connected to one another in a conductive manner without great outlay. According to the invention, this takes place by means of a material layer, particularly a silicon oxide layer, with embedded nanoparticles.

The particularly preferred embodiment provides producing a dielectric layer, particularly a ceramic layer, more preferably a silicon oxide layer, in which conductive nanoparticles are embedded. The layer according to the invention therefore constitutes a type of matrix composite material, comprised of a dielectric layer, which is used as matrix, and corresponding conductive particles, which are embedded in the matrix.

An idea of this embodiment according to the invention in particular includes the density of the conductive particles in the dielectric layer being realized to be of such a size that a coherent and therefore conductive network of the nanoparticles is created. The surface of the dielectric layer is still used for connecting two substrates, particularly solar cells, by means of a fusion bond. As the nanoparticles are present in a statistically distributed manner in the volume (and therefore also on the surface) of the dielectric layer and are to a large extent surrounded by a dielectric material, it is possible to speak of a hybrid bond in the case of the connection of two such layers. In contrast with industry-standard hybrid bonds, in which the electrically conductive connections were regularly distributed over the surface, these connections are irregular.

A method according to the invention for producing such a preferred layer according to the invention has the following steps, particularly the following procedure:

In a first step of a first embodiment of the method, electrical nanoparticles, are particularly exclusively applied to the surface of the substrate, particularly of a solar cell, to be connected. In order to distribute the nanoparticles in as fine a manner as possible, an application preferably takes place by means of a solution, which is applied by means of a spin-coating, preferably spray-coating process.

If the substrates, particularly solar cells, have diameters in the metre range, spray-coating processes are preferred.

An oxidation of the surface subsequently takes place in a second step, particularly by means of a native oxide. However, as this type of oxide production is carried out at relatively high temperatures, for the most part at a temperature greater than 100° C., preferably greater than 300° C., more preferably greater than 500° C., most preferably greater than 800° C., most preferably of all greater than 1000° C., this process is rather not suited to the production of an oxide layer. The solar cells are for the most part very temperature-sensitive, owing to the doping thereof, and must not be heated above a critical temperature.

In a third (optional) step, the thus-generated oxide surface can be ground back to a preferred thickness by means of a grinding process. The nanoparticles are therefore embedded into the dielectric layer and the dielectric layer is prepared by means of the grinding process for the direct bond to a second solar cell, the surface of which has been prepared in the same manner.

In a second more preferred embodiment of the method, the production of the dielectric layer takes place by means of a sol-gel process. A sol-gel process is a process, in which a sol (a colloidal dispersion of a chemical component) runs through an aggregation, gelling, drying and tempering process by means of a plurality of chemical and/or physical reactions. The sol or what is known as the precursor, is a liquid at the start of the process and is converted into a solid in the course of the process. In this case, it is particularly noticeable that primarily the production of ceramic layers, which would otherwise only be creatable by means of a high-temperature process, can take place wet chemically.

According to the invention, the conductive nanoparticles can be added to the sol as second component. The polymers of the sol form the dielectric material around the conductive nanoparticles by means of the sintering process and securely enclose the conductive nanoparticles. A wet-chemical embedding of conductive nanoparticles into a dielectric layer takes place by means of this procedure according to the invention at room temperature (particularly between 10° C. and 30° C.).

The dielectric layer can then (optionally) be back-thinned by means of grinding processes and therefore prepared for the bonding process.

Polishing of the surface takes place, in a further improvement of the process according to the invention, which is preferred according to the invention. A treatment of the surface by means of a chemical-mechanical polishing (CMP) process would also be conceivable. This processing is used for reducing the surface roughness and preparing the surface for a fusion bonding process.

The roughness is either specified as mean roughness, root mean square roughness or as mean roughness depth. The determined values for the mean roughness, the root mean square roughness and the mean roughness depth generally differ for the same measured distance or measured area, but lie in the same order of magnitude. Therefore, the following ranges of numerical values for the roughness are to be understood either as values for the mean roughness, the root mean square roughness or for the mean roughness depth. According to the invention, the roughness is in particular smaller than 100 μm, preferably smaller than 10 μm, more preferably smaller than 1 μm, most preferably smaller than 100 nm, most preferably of all smaller than 10 nm.

In this particular embodiment, the contacting between the n- and p-regions of two solar cells, which are connected to one another, takes place by means of the dielectric layer by means of the network of conductive nanoparticles. In this case, the nanoparticles preferably in turn have an average size, which minimizes the scattering, particularly the reflection, of the incident light. The considerations for light scattering are the same for nanoparticles as for the aforementioned light scattering at the contacts or vias.

It is also explicitly mentioned here that it is possible to dispense with an alignment of the substrates with respect to one another, as the nanoparticles are distributed in such a manner on the surface of a substrate that the nanoparticles produce a conductive connection between the substrates to the nanoparticles in the surface of the opposite substrate.

Any desired conductive material can fundamentally be used for producing the contact points and/or passages and/or nanoparticles. The following are particularly preferred pure metals, particularly
  Cu, Ag, Au, Al, Pt, Pb, Zn, Sn, W, Nb, Ta, Te and/or Nb,
alloys, particularly
  bronze alloys, preferably CuSn, and/or
  brass alloys and/or
  gold alloys and/or
  copper alloys, particularly CuAg, CuAg and/or CuAgSn, The conductivity of contact points constructed according to the invention and/or TSVs constructed according to the invention and/or nanoparticles constructed/introduced according to the invention is in particular greater than $1.0*10^4$ S/m, preferably greater than $1.0*10^5$ S/m, more preferably greater than $1.0*10^6$ S/m, most preferably greater than $1.0*10^7$ S/m, most preferably of all greater than $1.0*10^8$ S/m.

Further advantages, features and details of the invention result from the following description of preferred exemplary embodiments, as well as on the basis of the drawings.

BRIEF DESCRIPTION OF THE DRAWINGS

FIG. 4 shows a schematic side view of an enlargement of a substrate stack according to the invention in a second embodiment according to the invention with substrates oxidized on one side, FIG. 5 shows a schematic side view of an enlargement of a substrate stack according to the invention in a third embodiment according to the invention with substrates oxidized on two sides.

DETAILED DESCRIPTION OF THE INVENTION

Figure 1:
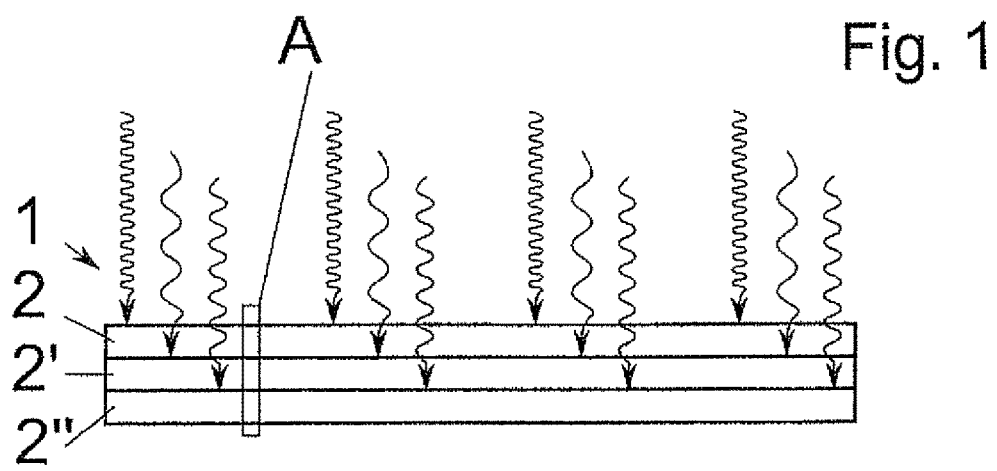
FIG. 1 shows a schematic view of an embodiment according to the invention of a substrate stack, comprised of three substrate layers.

FIG. 1 shows a schematic cross-sectional view of a substrate stack 1 according to the invention, comprised of three substrates 2, 2', 2''. The stacking of more or fewer than three substrates 2, 2', 2'' is also conceivable. The wavelength sensitivity of the substrates is symbolized by wave trains with different wavelength, which represent the electromagnetic waves, in the sense of the partial image, actually the photons. Corresponding contacts for tapping the total voltage generated by the solar cell stack on the outer side are not shown.

Figure 2:
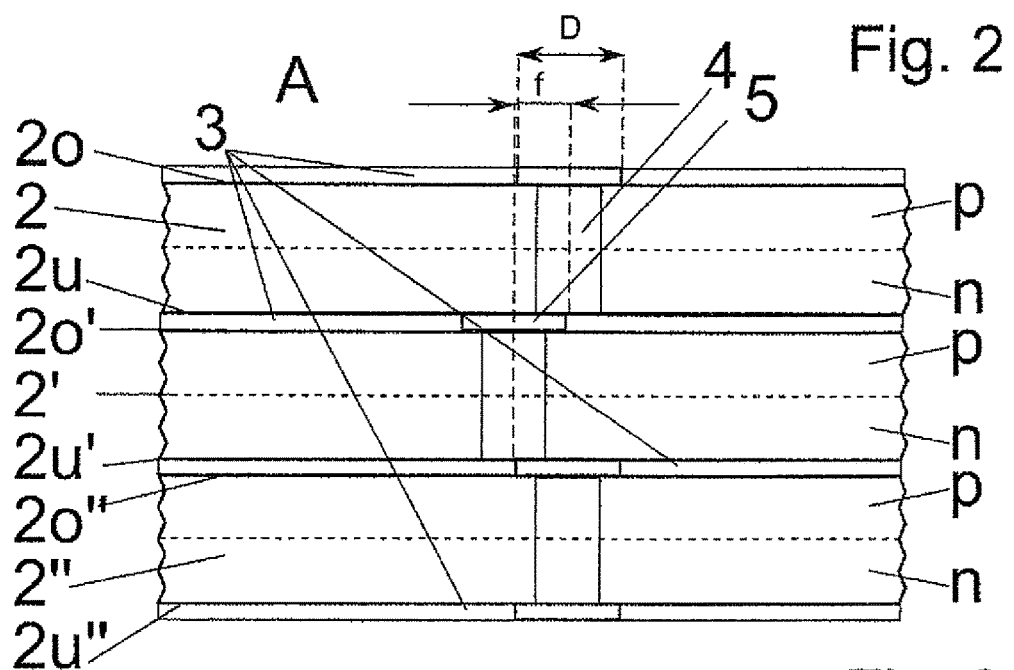
FIG. 2 shows a schematic side view of an enlargement of a substrate stack according to the invention in a first embodiment according to the invention with substrates oxidized on one side.

FIG. 2 shows an enlargement of the section A of the schematic cross-sectional view according to FIG. 1 in a first embodiment according to the invention, in which one can see dielectric layers, particularly oxide layers, 3, by means of which the substrates 2, 2', 2'' have been connected to one another.

The dielectric layers 3 alternate in this case between the individual substrates 2, 2', 2''. This alternation is preferably achieved in such a manner that always only the surfaces 2o, 2o', 2o'' of the substrates 2, 2', 2'' are oxidized and are connected to a respectively non-oxidized surface 2u, 2u', 2u'' of a second substrate 2, 2', 2''. The final oxidation of one of the outer substrates 2, 2', 2'' can take place after the connection of the substrates 2, 2', 2'' and has likewise been shown. Should for example the substrate 2'' be the last and/or lowermost substrate in the substrate stack 1, an oxidation of the surface 2u'' is conceivable, in order to fully enclose the substrate stack with oxide. An oxidation of the surface 2u'' of this type is illustrated in FIG. 2. In this specific embodiment according to the invention, passages 4 create a conductive connection between two substrates 2, 2', 2'' in each case. The tapping of the voltage takes place at outer, exposed contact points 5, which have a diameter D.

The connection of the substrates 2, 2', and 2'' can theoretically likewise take place by means of a direct bond. If, however, the materials of the substrates 2, 2', 2'' are different from the materials of the dielectric layer 3, the thus-created direct bonding does not take place with optimum quality.

The production of the contact points 5 takes place with very imprecise masks and processes, wherein the average diameter D of the contact points 5 is larger than the average alignment error f between the respective adjacent contact points 5. Thus, the production of the contact points 5 on the respective substrate can also take place faster and less expensively. The ratio between the diameter D and the average alignment error f is approximately 2 in the embodiment shown.

Figure 3:
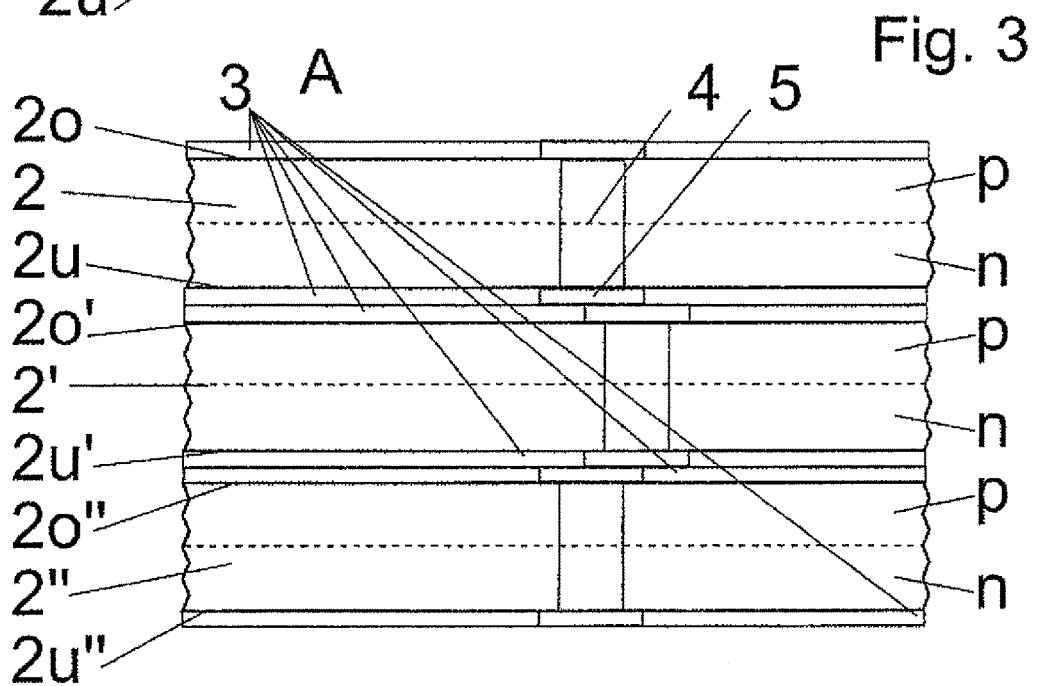
FIG. 3 shows a schematic side view of an enlargement of a substrate stack according to the invention in a first embodiment according to the invention with substrates oxidized on two sides.

A preferred embodiment according to the invention therefore includes oxidizing all surfaces 2o, 2o', 2o'', 2u, 2u', 2u'', all substrates 2, 2', 2'' according to FIG. 3, to create an, in particular full-area, dielectric layer 3. Owing to the oxidation of both surfaces 2o, 2o', 2o'', 2u, 2u', 2u'' of the substrates 2, 2', 2'', contact points 5 in the dielectric layers are simultaneously and/or subsequently created on both sides of the substrates 2, 2', 2''. FIG. 4 shows a particular embodiment, which is interesting for the solar industry, in which no passages 4 exist. The tapping of the voltage takes place at the outer, exposed contact points 5. The individual p- and n-transitions are alternately connected to one another by means of the contact points 5 located in the bond interface. Should it be expedient to nonetheless incorporate corresponding passages 5, these can be produced according to FIGS. 2-3.

FIG. 5 shows an embodiment according to the invention of the two-sided oxidation of a substrate 2, 2', 2'' without TSVs.

Figure 6:
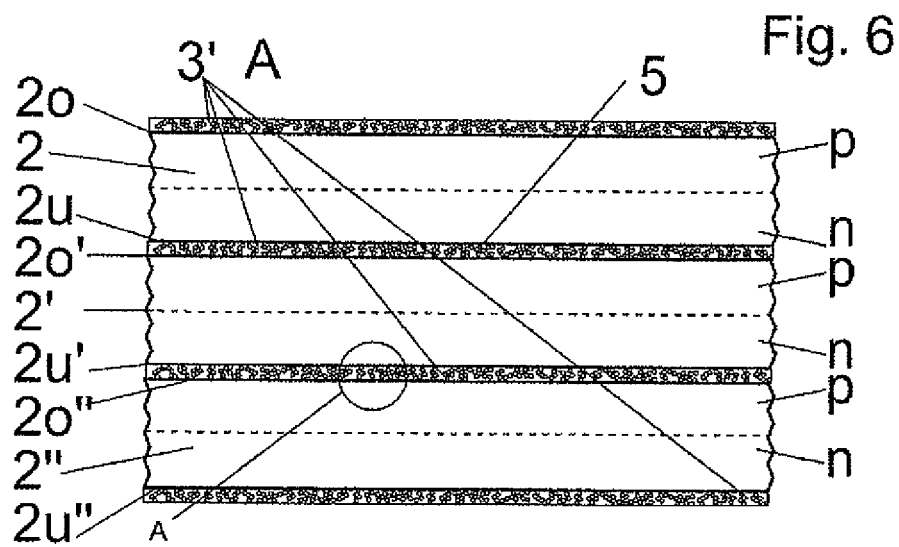
FIG. 6 shows a schematic side view of an enlargement of a substrate stack according to the invention in a third embodiment according to the invention with substrates oxidized on one side.
Figure 7:
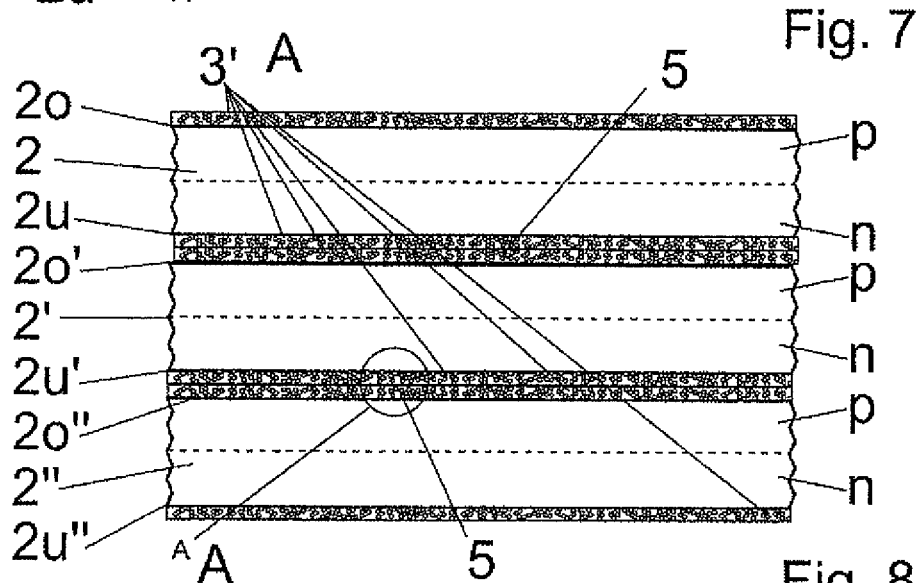
FIG. 7 shows a schematic side view of an enlargement of a substrate stack according to the invention in a fourth embodiment according to the invention with substrates oxidized on two sides.

FIGS. 6 and 7 show the most preferred embodiments according to the invention. The conductive connection between the n- and p-regions of the substrates 2, 2', 2'' is not produced by contact points 5, which have been introduced regularly or irregularly into the dielectric layers 3, but rather by a network of nanoparticles 6, which have been embedded into the dielectric layer 3'. The density of the dielectric nanoparticles 6 is so large in this case that an electrical conductive connection between the n-region of the one solar cell and the p-region of the second solar cell always results. It is also conceivable to arrange the nanoparticles 6 only in one part region of the dielectric layer 3', at which contacting should take place.

Figure 8:
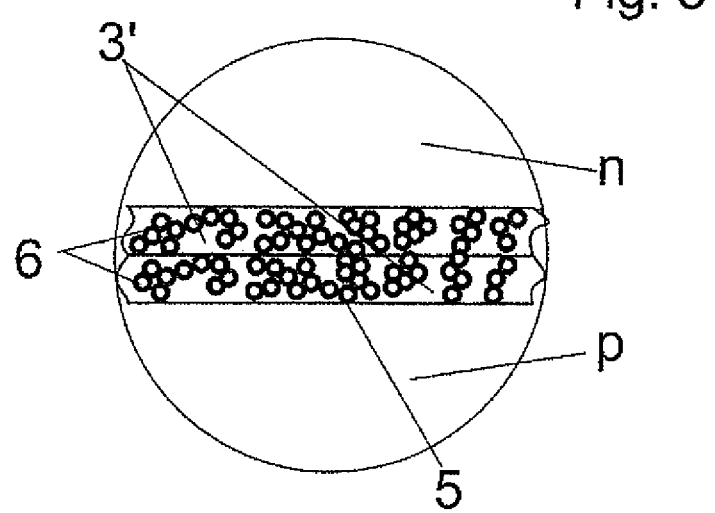
FIG. 8 shows a schematic side view of an enlargement of the preferred embodiment of a substrate stack according to the invention.

FIG. 8 shows an enlargement of the dielectric layers V with the corresponding nanoparticles 6.

The contact points 5 located on the outer side of the substrate stack I according to the invention are preferably used for voltage tapping.

In very specific, and therefore not preferred, embodiments, it may also be possible to dispense with the oxide layers 3 completely, in order to connect the solar layers 2, 2', 2'' to one another directly.

Figure 9A:
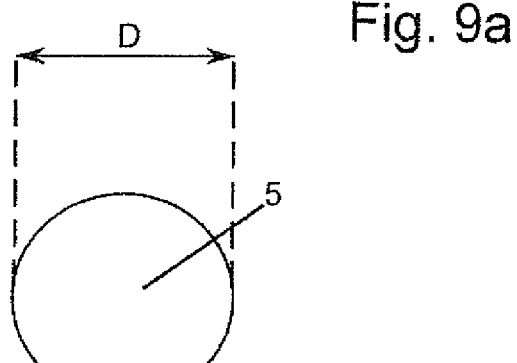
FIG. 9a shows a schematic view of a first contact point according to the invention.
Figure 9B:
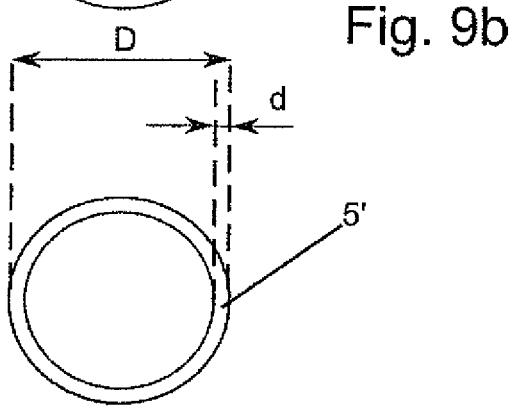
FIG. 9b shows a schematic view of a second contact point according to the invention and FIG. 9c shows a schematic view of a third contact point according to the invention.
Figure 9C:
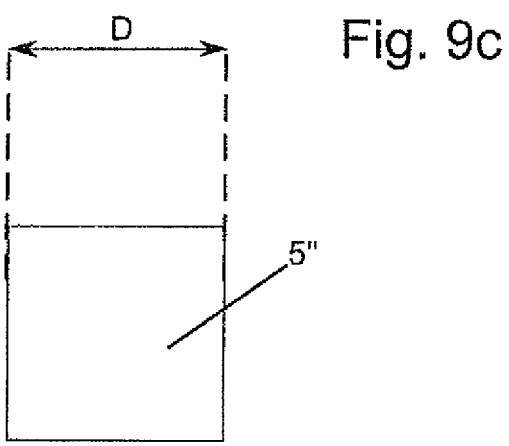

The FIGS. 9a-c show three contact points 5, 5' and 5'' according to the invention. The two contact points 5 and 5'' according to the invention cover the whole area, whilst the second contact point 5' according to the invention is constructed in a ring-shaped manner. The contact point 5' according to the invention has the diameter D and a ring width d. Two such contact points 5' located on substrates 2, 2', 2'', which are opposite one another in each case, overlay one another either completely or intersect in two or one intersection point. As the complete overlaying and the contacting reduced to one point is somewhat unlikely in the case of positioning and contacting (carried out without alignment plants), two such contact points will in practice to a large extent or always intersect at two intersection points. Electricity transmission is then reduced to the two contact points. The larger is the diameter D of the contact point 5', the less sensitively the embodiment according to the invention reacts to alignment errors, as a larger diameter D also means a greater likelihood of contacting.

REFERENCE LIST 1, 1' Substrate stack
2, 2', 2" Substrate
2o, 2o' 2o" Substrate surface
2u, 2u', 2u" Substrate surface
3, 3' Dielectric layer
4 Passage
5, 5', 5" Contact point
6 Nanoparticles
p p-doping layer of the semiconductor substrate
n n-doping layer of the semiconductor substrate
D Average diameter
f Average alignment error Having described the invention, the following is claimed:

1. A method for producing a multiple-substrate stack, the method comprising: providing a first wavelength-sensitive semiconductor substrate constructed as a first solar cell and at least a second wavelength-sensitive semiconductor substrate constructed as a second solar cell,
applying dielectric layers containing electrically conductive particles onto respective contacting opposite substrate surfaces of the first and at least second semiconductor substrates, and
contacting the first semiconductor substrate with the at least second semiconductor substrate at each of the dielectric layers containing electrically conductive particles, thereby forming an electrically conductive connection between the semiconductor substrates,
wherein after or during the contacting of the semiconductor substrates, forming a permanent fusion-bond between the semiconductor substrates.

2. The method according to claim 1, in which each of the semiconductor substrates has an n-doping layer and a p-doping layer, wherein adjacent semiconductor substrates in each case abut, by way of an n-doped layer, against a p-doping layer of an adjacent semiconductor substrate.

3. The method according to claim 1, wherein each of the dielectric layers containing electrically conductive particles is constructed as a matrix composite material by means of a sol-gel process to which the conductive particles are added.

4. The method according to claim 3, wherein each of the dielectric layers is constructed as a ceramic layer.

5. The method according to claim 3, wherein each of the dielectric layers is constructed as a silicon oxide layer.

6. The method according to claim 1, wherein the electrically conductive particles are nanoparticles.

7. The method according to claim 6, further comprising selecting an average diameter of the conductive nanoparticles to correspond to a low value of at least one of an absorption capacity or a scattering potential for a sensitive wavelength range of at least one of the first and second solar cells.

8. The method according to claim 7, further comprising selecting the average diameter of the electrically conductive nanoparticles to be smaller than 10 nm.

9. The method according to claim 1, further comprising applying nanoparticles to each of the dielectric layers, at least in certain sections, and subsequent oxidation of the dielectric layers by means of a native oxide.

10. The method according to claim 1, wherein the semiconductor substrates are constructed in a wavelength-sensitive manner in, at least partially, different wavelength ranges.

11. The method according to claim 10, wherein the semiconductor substrates are constructed in a wavelength-sensitive manner in completely different wavelength ranges.

12. The method according to claim 1, wherein a mechanical alignment of the semiconductor substrates takes place before or during the contacting of the semiconductor substrates without optical means and/or without optical alignment markings on the semiconductor substrates.

13. The method according to claim 1, wherein the semiconductor substrates have electrically conductive passages for the electrically conductive connection of substrate surfaces of each of the semiconductor substrates, wherein said substrate surfaces face away from one another in each case.

14. The method according to claim 13, wherein each of the dielectric layers are constructed only in certain sections at the passages with electrically conductive contact points.

15. The method according to claim 14, wherein the contact points are constructed with a diameter D, which is at least the same size as, an average alignment error f during contacting.

16. The method according to claim 15, wherein the diameter D is larger than the average alignment error f during contacting.

17. A method for producing a multiple-substrate stack, the method comprising:
providing a first wavelength-sensitive semiconductor substrate constructed as a first solar cell and at least a second wavelength-sensitive semiconductor substrate constructed as a second solar cell,
applying dielectric layers onto respective contacting opposite substrate surfaces of the first and at least second semiconductor substrates,
applying electrically conductive nanoparticles to each of the dielectric layers, at least in certain sections, and subsequent oxidation of the dielectric layers by means of a native oxide, and
contacting the first semiconductor substrate with the at least second semiconductor substrate at each of the dielectric layers containing electrically conductive particles, thereby forming an electrically conductive connection between the semiconductor substrates,
wherein after or during the contacting of the semiconductor substrates, forming a permanent fusion-bond between the semiconductor substrates.

* * * * *